(12) United States Patent
Yamane et al.

(10) Patent No.: US 10,170,900 B2
(45) Date of Patent: Jan. 1, 2019

(54) ELECTRICAL CONNECTION BOX

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Shigeki Yamane, Mie (JP); Yoshikazu Sasaki, Mie (JP); Takehito Kobayashi, Mie (JP); Yukinori Kita, Mie (JP); Tomohiro Ooi, Mie (JP); Junya Aichi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/324,206

(22) PCT Filed: Jul. 9, 2015

(86) PCT No.: PCT/JP2015/069724
§ 371 (c)(1),
(2) Date: Jan. 5, 2017

(87) PCT Pub. No.: WO2016/009930
PCT Pub. Date: Jan. 21, 2016

(65) Prior Publication Data
US 2017/0214230 A1 Jul. 27, 2017

(30) Foreign Application Priority Data

Jul. 16, 2014 (JP) .................................. 2014-145984

(51) Int. Cl.
*H05K 7/14* (2006.01)
*H02G 3/16* (2006.01)
(Continued)

(52) U.S. Cl.
CPC ........... *H02G 3/16* (2013.01); *B60R 16/0238* (2013.01); *H01F 27/04* (2013.01);
(Continued)

(58) Field of Classification Search
None
See application file for complete search history.

(56) References Cited

U.S. PATENT DOCUMENTS 4,632,497 A * 12/1986 Boysen .................. H01H 50/14
439/733.1
2001/0029120 A1* 10/2001 Miyazaki ......... H01R 13/65802
439/98

(Continued)

FOREIGN PATENT DOCUMENTS

JP 2004327185 A 11/2004
JP 2011076886 4/2011

(Continued)

OTHER PUBLICATIONS

Search Report for European Application No. 15821611.9, dated Feb. 23, 2017, 5 pp.

*Primary Examiner* — Courtney L Smith
(74) *Attorney, Agent, or Firm* — Honigman Miller Schwartz and Cohn LLP

(57) ABSTRACT

An electrical connection box includes a bus bar, a case to which the bus bar is fixed, a terminal that is connected to the bus bar, a fixing member that fixes a connection portion at which the terminal and the bus bar are connected to each other, and a base member that holds the fixing member. The fixing member and the base member are disposed at a position at which the fixing member and the base member (Continued)

overlap the connection portion of the bus bar, and when the connection portion at which the terminal and the bus bar are connected to each other is fixed, the base member moves in a direction in which the base member comes into contact with the bus bar.

8 Claims, 15 Drawing Sheets

(51) Int. Cl.
      *H01F 27/30*     (2006.01)
      *H01R 4/30*     (2006.01)
      *H02G 3/08*     (2006.01)
      *B60R 16/023*     (2006.01)
      *H01F 27/04*     (2006.01)
      *H01F 27/28*     (2006.01)
      *H05K 7/02*     (2006.01)
      *H01R 4/34*     (2006.01)

(52) U.S. Cl.
    CPC ..... *H01F 27/2828* (2013.01); *H01F 27/2847* (2013.01); *H01F 27/306* (2013.01); *H01R 4/302* (2013.01); *H02G 3/081* (2013.01); *H05K 7/026* (2013.01); *H05K 7/14* (2013.01); *H01R 4/34* (2013.01)

(56) References Cited

U.S. PATENT DOCUMENTS

| | | | |
|---|---|---|---|
| 2004/0214477 A1 | 10/2004 | Ikeda | |
| 2007/0218736 A1* | 9/2007 | Takizawa | H01R 11/01 439/247 |
| 2008/0124985 A1* | 5/2008 | Matsumoto | H05K 7/1432 439/709 |
| 2010/0231038 A1* | 9/2010 | Sugimura | B60R 16/0238 307/9.1 |
| 2011/0117792 A1 | 5/2011 | Kaneshiro | |
| 2012/0106099 A1* | 5/2012 | Kita | H05K 1/0269 361/748 |
| 2013/0028683 A1* | 1/2013 | I | B60R 16/0238 411/166 |
| 2014/0273554 A1* | 9/2014 | Sugimoto | B60R 16/0238 439/76.2 |

FOREIGN PATENT DOCUMENTS

| | | |
|---|---|---|
| JP | 2013031293 A | 2/2013 |
| JP | 2013099071 A | 5/2013 |
| JP | 2014103747 A | 6/2014 |

\* cited by examiner

ELECTRICAL CONNECTION BOX

CROSS-REFERENCE TO RELATED APPLICATIONS

This application is the U.S. national stage of PCT/JP2015/069724 filed Jul. 9, 2015, which claims priority of Japanese Patent Application JP 2014-145984 filed Jul. 16, 2014.

FIELD OF THE INVENTION

The present invention relates to an electrical connection box.

BACKGROUND OF THE INVENTION

An electrical connection box disclosed in Patent Document 1, for example, is known as an electrical connection box installed in a vehicle or the like. In this electrical connection box, one end of a bus bar bent in a Z shape is in contact with a heat dissipation plate and the other end is connected to a coil.

In the above-described electrical connection box, the position of the bus bar is defined by the position of a portion where it contacts the heat dissipation plate and the position of a portion where it is connected with the coil. Here, if the portion where the bus bar contacts the heat dissipation plate is a defined position and the portion where the bus bar is connected to the coil is higher than that defined position, then there is a concern that the bus bar will be pressed downward, deform, and cause failure in contact with the coil, resulting in a decrease in the reliability of the electrical connection or an increase in the temperature. On the other hand, if the portion where the bus bar is connected to the coil is lower than the defined position, then there is a risk that the bus bar will separate from the surface of the heat dissipation plate and the temperature of a component on the bus bar will increase, resulting in operation failure.

The present invention has been achieved based on the above-described circumstances and an object of the present invention is to provide an electrical connection box with high electrical connection reliability, the electrical connection box being such that failure in contact between a bus bar and a member that is connected to the bus bar is prevented.

SUMMARY

The present invention is an electrical connection box including a bus bar, a case to which the bus bar is fixed, a terminal that is connected to the bus bar, a fixing member that fixes a connection portion at which the terminal and the bus bar are connected to each other, and a base member that holds the fixing member. The fixing member and the base member are disposed at a position at which the fixing member and the base member overlap the connection portion of the bus bar, and when the connection portion at which the terminal and the bus bar are connected to each other is fixed, the base member moves in a direction in which the base member comes into contact with the bus bar.

In the present invention, when the connection portion at which the terminal and the bus bar are connected to each other is fixed after the fixing member and the base member are disposed at the position at which the fixing member and the base member overlap the connection portion of the bus bar, the fixing member and the base member move in a direction in which they come into contact with the bus bar and then they come into contact with the bus bar. Therefore, according to the present invention, because the bus bar and the terminal to which the bus bar is connected are in stable contact with each other, it is possible to provide an electrical connection box with high electrical connection reliability, the electrical connection box being such that failure in contact between the bus bar and a member that is connected to the bus bar and an increase in the temperature of the contact point resulting from failure in contact are prevented.

The present invention may have the following configurations.

The case may be a heat dissipation member made of a heat conductive material.

Such a configuration improves heat dissipation of the case because the heat generated in the bus bar is dissipated to the outside of the case via the heat dissipation member due to the heat dissipation function of the case.

An electronic component may be connected to the terminal.

Such a configuration makes it possible to increase the reliability of electrical connection between the terminal to which the electronic component is connected and the bus bar.

The electronic component may be a coil.

Such a configuration makes it possible to prevent an increase in the temperature of the electrical connection box because the heat generated in the coil is transmitted to the bus bar.

A wiring member may be connected to the terminal.

Such a configuration makes it possible to increase the reliability of electrical connection between the terminal to which the wiring member is connected and the bus bar.

The wiring member may be an electrical wire.

Such a configuration makes it possible to increase the reliability of electrical connection between the terminal to which the electrical wire is connected and the bus bar.

According to the present invention, it is possible to provide an electrical connection box with high electrical connection reliability, the electrical connection box being such that failure in contact between a bus bar and a member that is connected to the bus bar is prevented.

DETAILED DESCRIPTION

Embodiment 1

Figure 1:
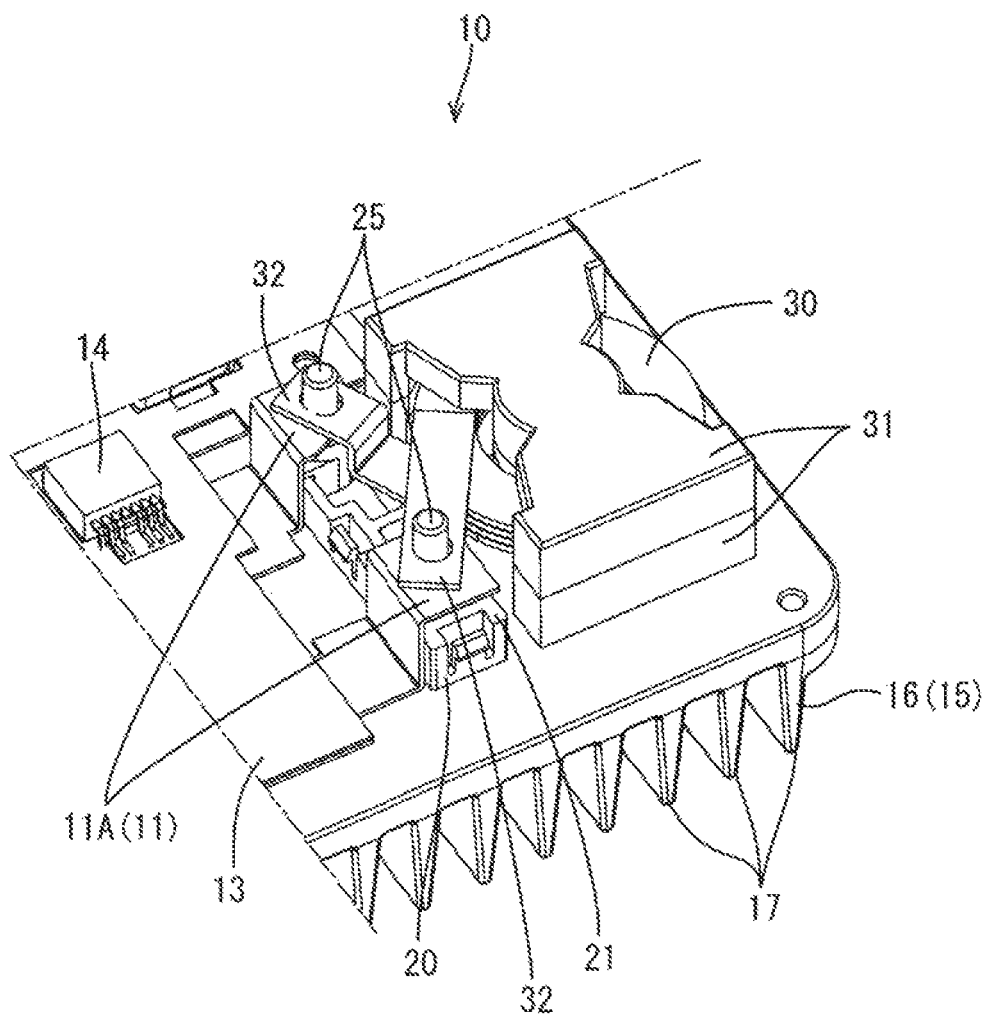
FIG. 1 is a perspective view of a portion of an electrical connection box according to Embodiment 1.
Figure 2:
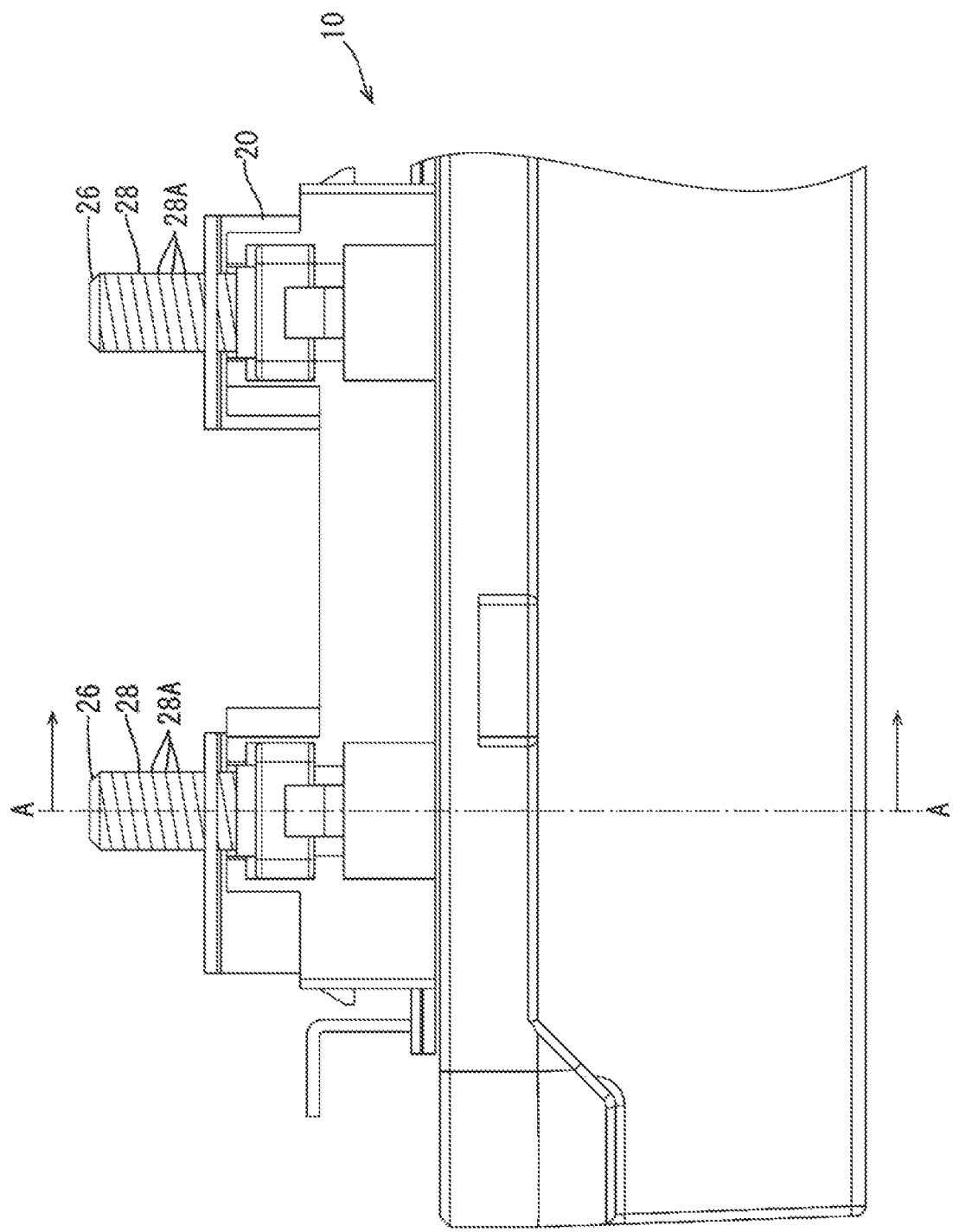
FIG. 2 is a side view of a portion of the electrical connection box.

Embodiment 1 of the present invention will be described with reference to FIGS. 1 to 14.

An electrical connection box 10 of the present embodiment includes a bus bar 11, a case 15 to which the bus bar 11 is fixed, a terminal 32 that is connected to the bus bar 11, a fixing member 25 that fixes a connection portion 11A at which the terminal 32 and the bus bar 11 are connected to each other, a base member 20 (an example of the base member that holds the fixing member) having a base portion 21 that locks (engages) the fixing member 25.

Bus Bar 11

Figure 3:
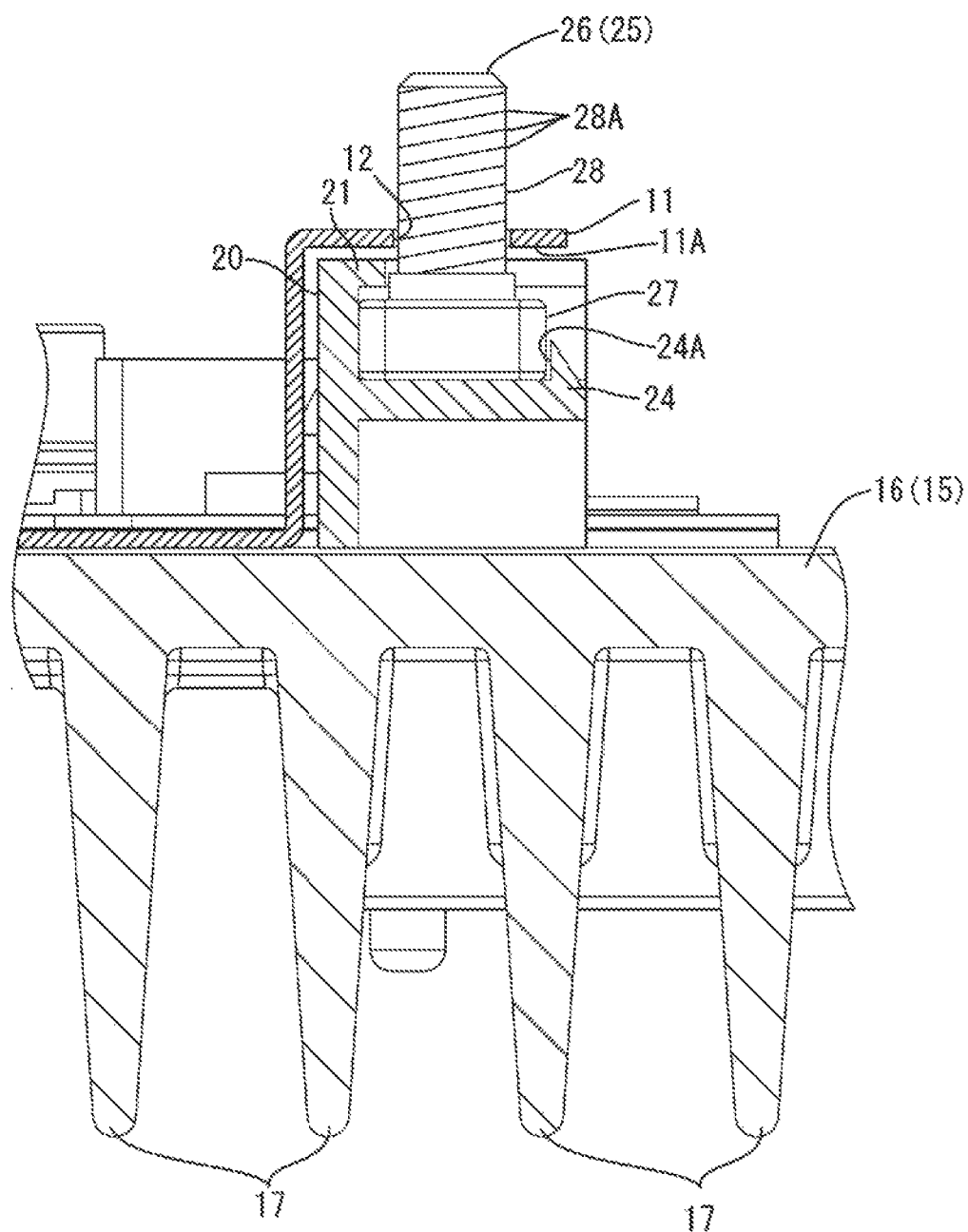
FIG. 3 is a cross-sectional view of a portion taken along line A-A in FIG. 2.
Figure 4:
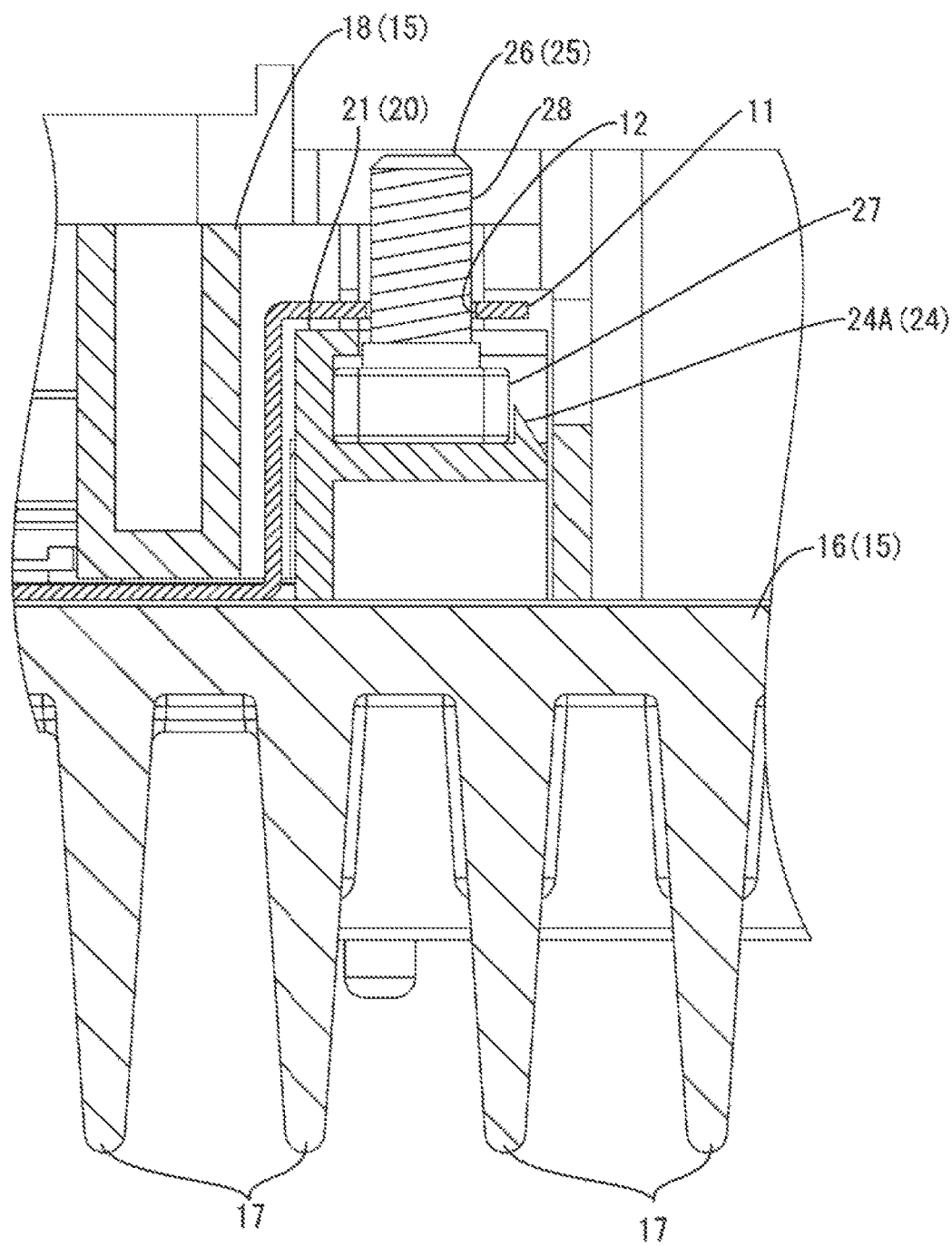
FIG. 4 is a cross-sectional view of a portion showing a state in which the portion shown in FIG. 3 is accommodated in a frame body (case).

The bus bar 11 is formed by bending, as shown in FIG. 3, a plate material made of metal such as copper, a copper alloy, aluminum, or an aluminum alloy. One end of the bus bar 11 is the connection portion 11A that is connected to the terminal 32 of the coil 30 (an example of an electronic component). On the other hand, as shown in FIG. 1, the other end of the bus bar 11 is bonded to the back surface of a circuit board 13 via a bonding sheet (not shown), and is fixed in contact with the surface of a heat dissipation member 16 (an example of the case 15) via an insulating material (not shown). The connection portion 11A of the bus bar 11 is disposed between the terminal 32 of the coil 30 and the base portion 21 of the base member 20. A fixing member insertion hole 12 into which the fixing member 25 attached to the base member 20 can be inserted is formed through the connection portion 11A of the bus bar 11. A conductive path (not shown) is formed on the circuit board 13 by printing wiring, and as shown in FIG. 1, an electronic component 14 such as a transistor is installed on its surface (the top surface in FIG. 1).

Case 15

Figure 5:
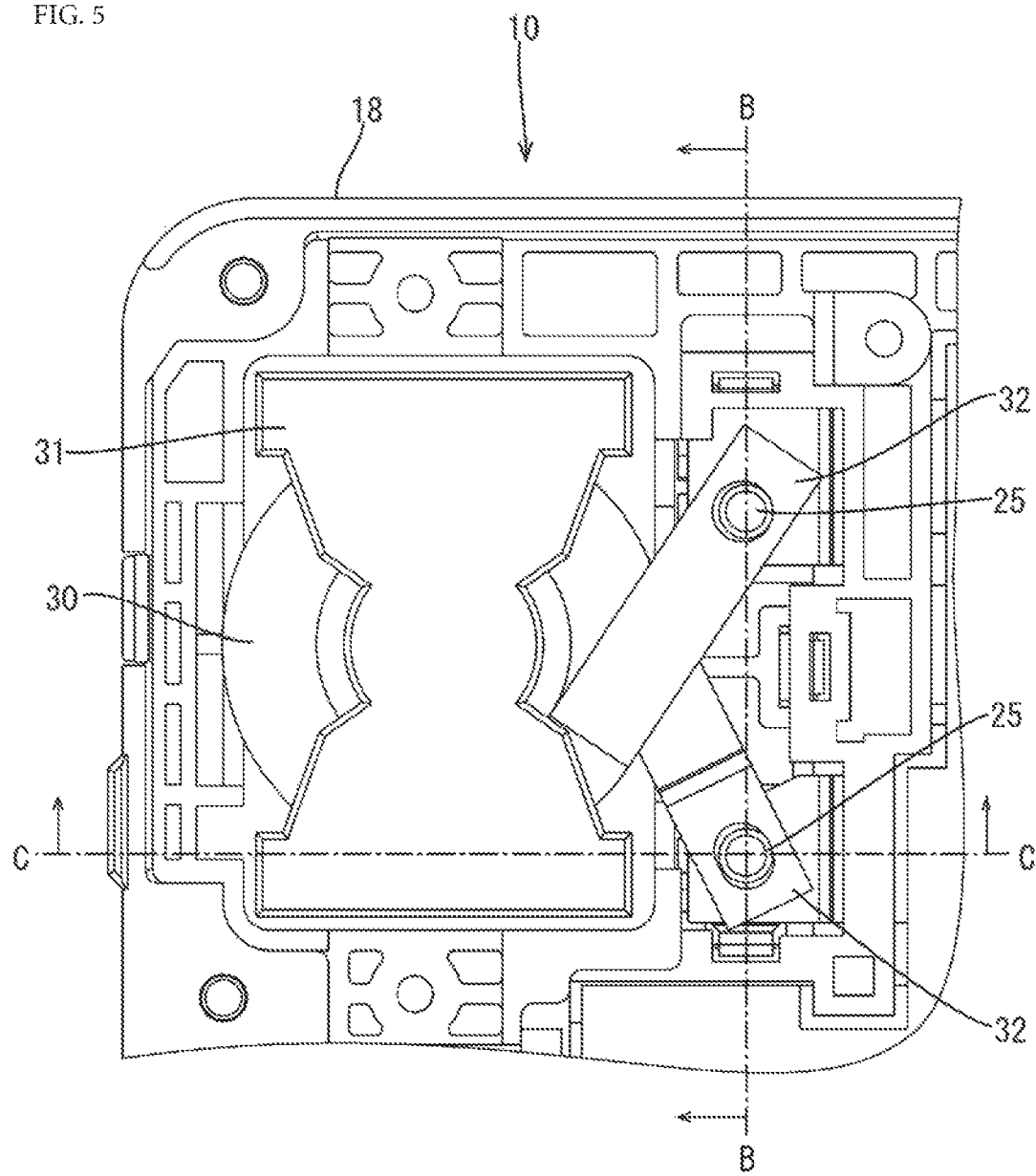
FIG. 5 is a plan view of a portion of the electrical connection box accommodated in the frame body.
Figure 6:
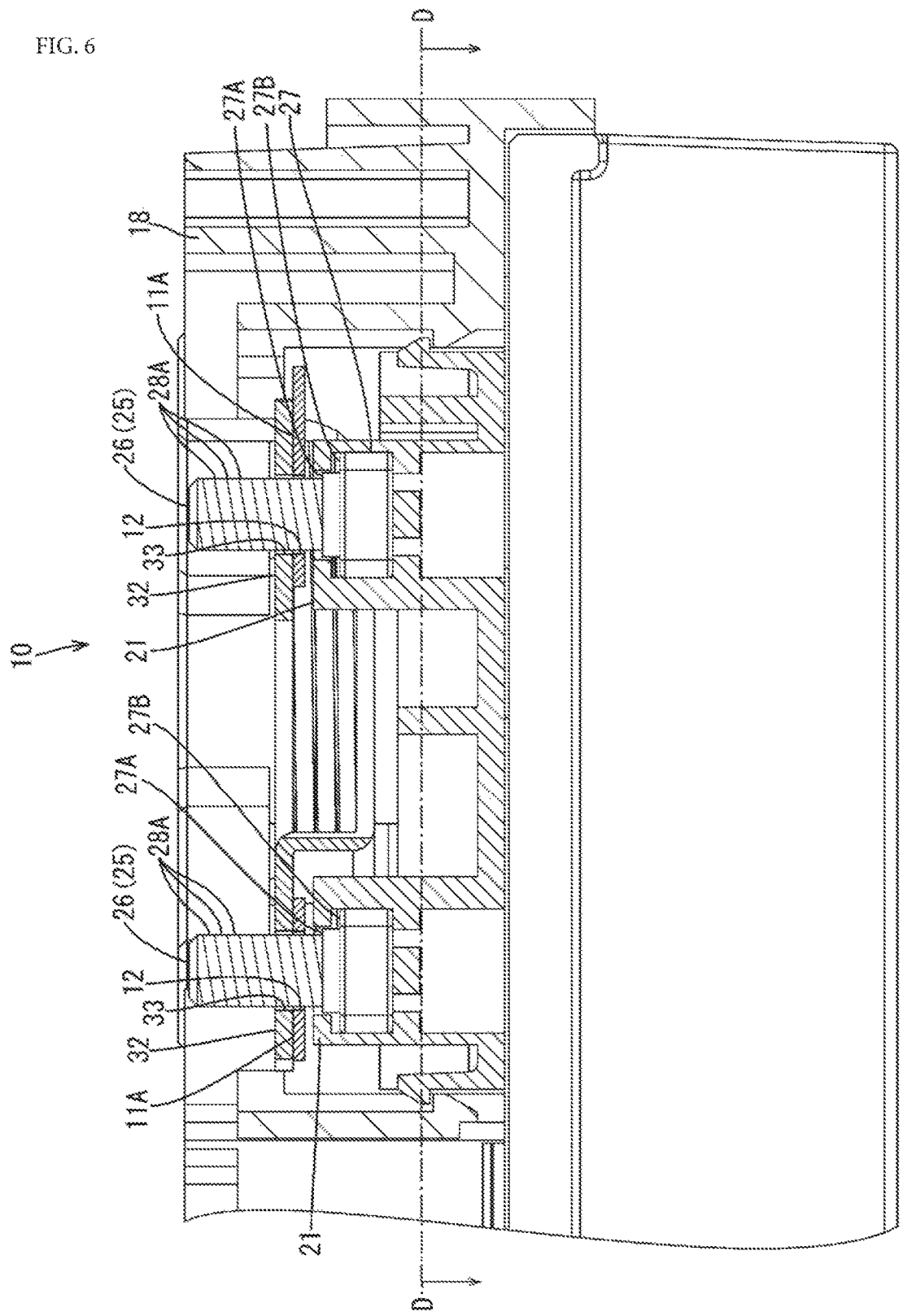
FIG. 6 is a cross-sectional view of a portion taken along line B-B in FIG. 5.
Figure 7:
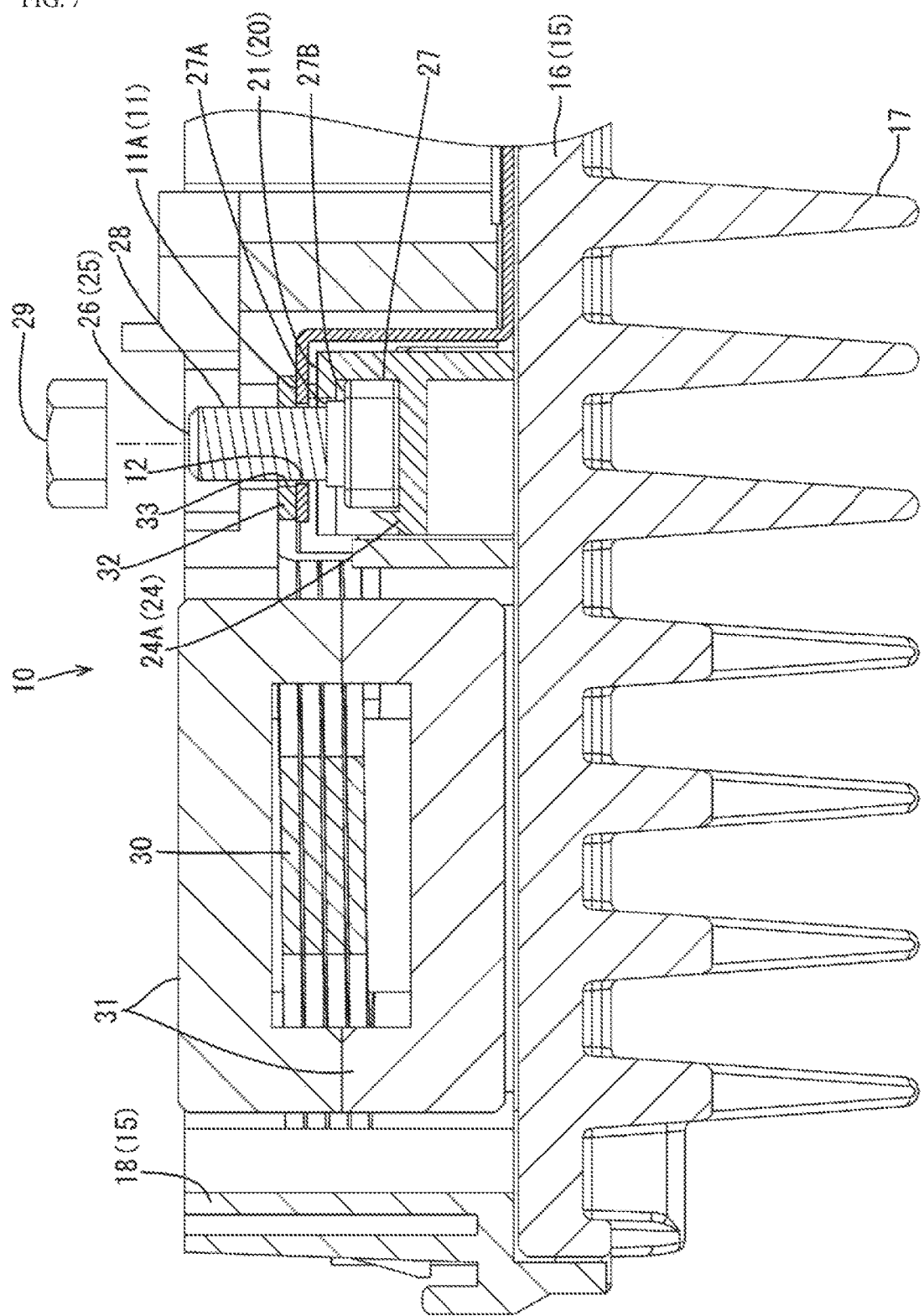
FIG. 7 is a cross-sectional view of a portion taken along line C-C in FIG. 5.
Figure 9:
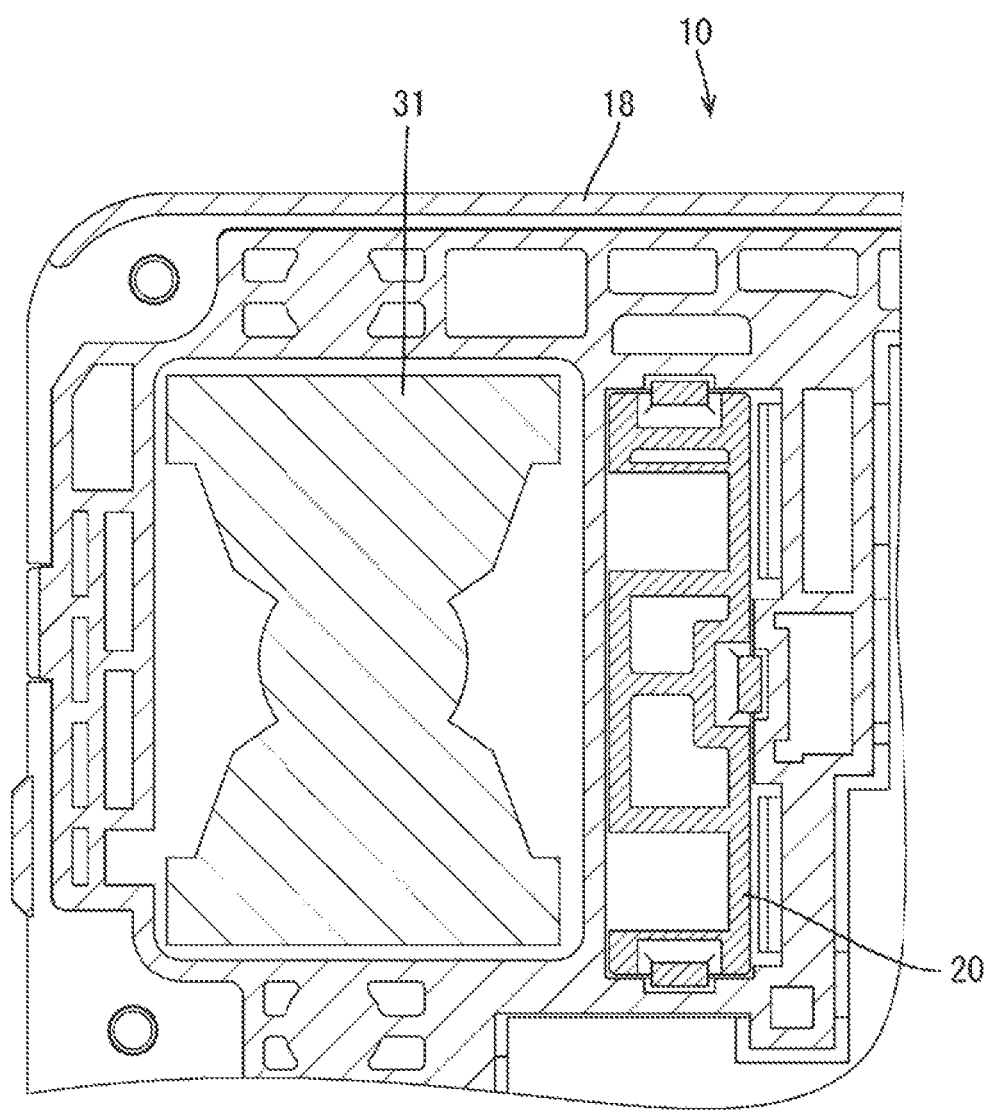
FIG. 9 is a cross-sectional view of a portion taken along line D-D in FIG. 6.
Figure 10:
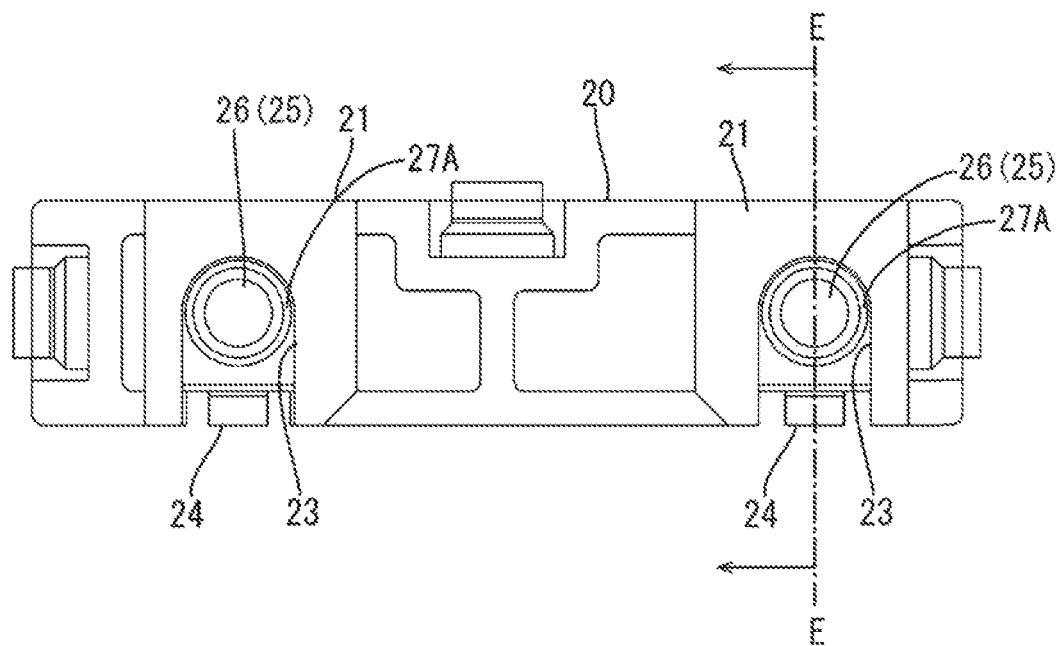
FIG. 10 is a plan view of a base member to which a fixing member is attached.
Figure 11:
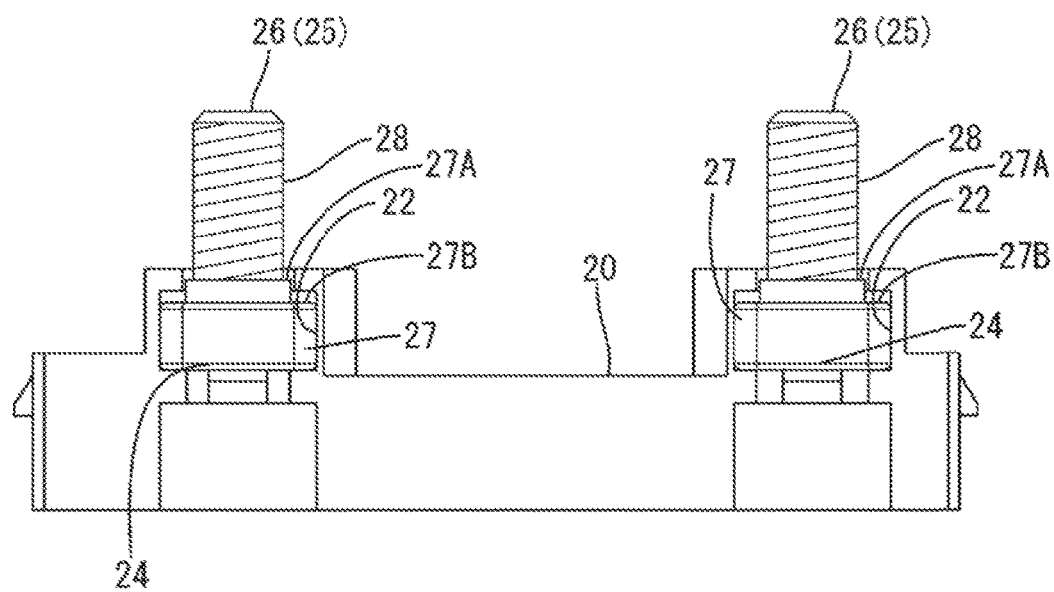
FIG. 11 is a side view of the base member to which the fixing member is attached.
Figure 12:
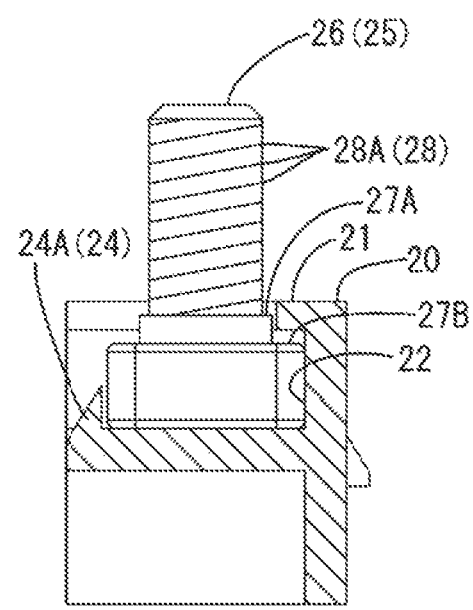
FIG. 12 is a cross-sectional view taken along line E-E in FIG. 10.

As shown in FIG. 7, the case 15 includes the heat dissipation member 16 on which the coil 30 and the base member 20 are placed, a frame body 18 having a frame shape, and a cover (not shown) disposed on the frame body 18. The heat dissipation member 16 is made of a heat conductive material, and multiple heat dissipation fins 17 are formed on a lower surface of the heat dissipation member 16. As shown in FIGS. 5 and 9, the frame body 18 is disposed on a circumference of members placed on the heat dissipation member 16.

Coil 30

Figure 8:
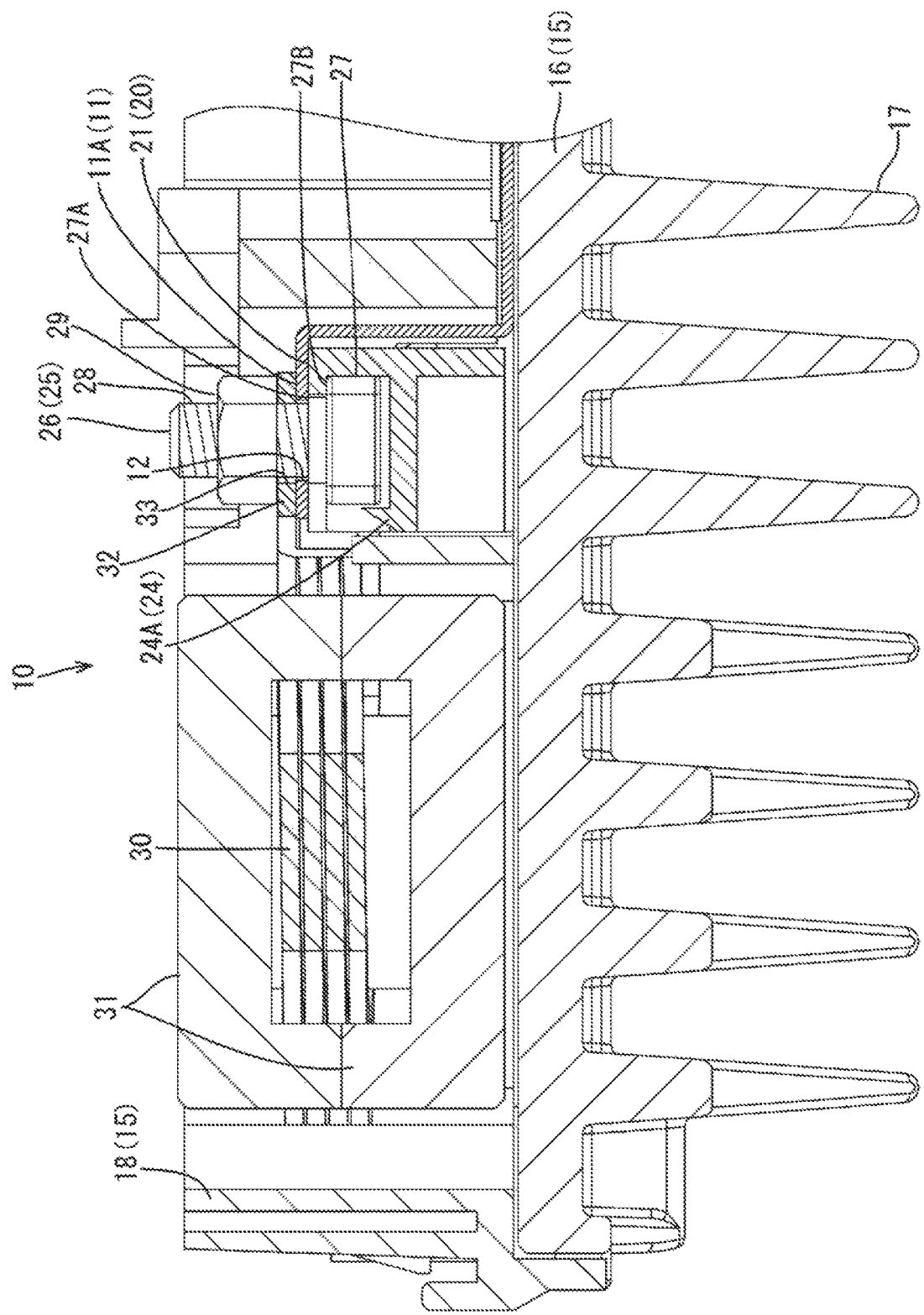
FIG. 8 is a cross-sectional view of a portion after fixed by a fixing member.

As shown in FIG. 8, the coil 30 is held movably so that it can be moved vertically between two magnetic materials 31 that are disposed one above the other. As shown in FIGS. 1 and 5, ends of the coil 30 intersect with each other, and function as the terminals 32 formed bypassing the fixing members 25 attached to the base members 20 through insertable fixing member insertion through holes 33. The fixing member 25 is inserted through holes 33 of the terminals 32 and the ends of the coil 30 overlap each other where the fixing member insertion holes 12 are provided in the connection portions 11A of the bus bars 11.

Fixing Member 25

As shown in FIG. 7, the fixing member 25 has a bolt portion 26 having a bolt shape and a nut portion 29 that is screwed to the bolt portion 26. The bolt portion 26 is attached with its head 27 downward such that its leg 28 protrudes from the upper portion of the base member 20. A threaded portion 28A is formed on the leg 28 of the bolt portion 26, and the nut portion 29 is screwed to this threaded portion 28A. The leg 28 of the bolt portion 26 is inserted into the fixing member insertion hole 12 of the bus bar 11 and the fixing member insertion through hole 33 of the terminal 32. The head 27 of the bolt portion 26 has a step shape, and the upper surface of the head 27 is a base 27A that abuts against the lower surface of the bus bar (see FIG. 7). A flange 27B below the base 27A of the head 27 is configured to come into contact with the lower surface of the base portion 21 of the base member 20 when the nut portion 29 is completely screwed on the head 27 of the bolt portion 26.

Base Member 20

Figure 13:
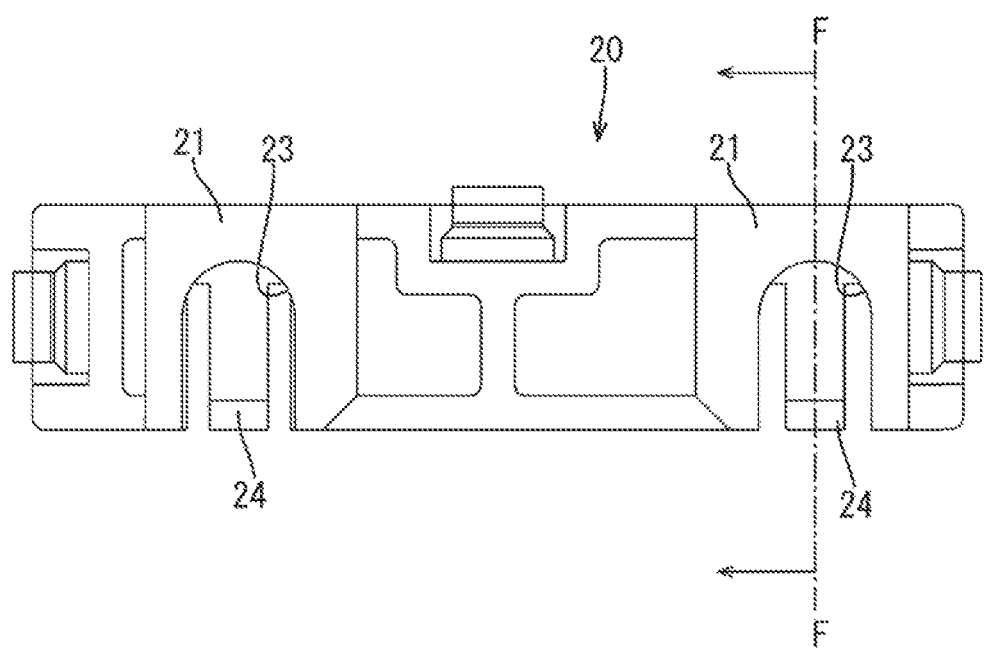
FIG. 13 is a plan view of the base member.

As shown in FIGS. 11 to 14, the base member 20 has a fixing member holding portion 22 that holds the fixing member 25, and a base portion 21 that fixes the terminal 32 and the bus bar 11. The fixing member holding portion 22 is provided with a fixing member insertion portion 23 into which the fixing member 25 is inserted and a locking piece 24 that locks the fixing member 25. As shown in FIG. 13, the fixing member insertion portion 23 is formed by cutting away a portion of an upper surface from the side surface of the base member 20.

Functional Effects of Present Embodiment

Next, the functional effects of the present embodiment will be described.

Figure 14:
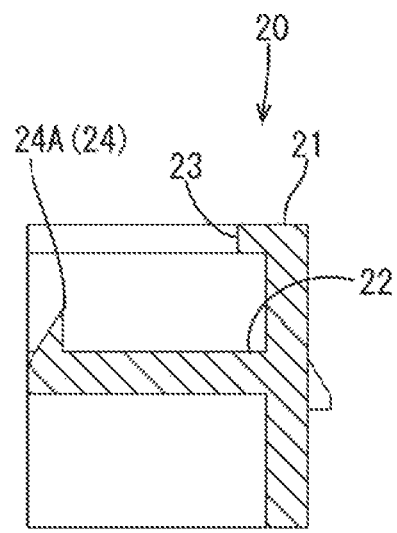
FIG. 14 is a cross-sectional view taken along line F-F in FIG. 13.

When the fixing member 25 is inserted from the left side in FIG. 14 into the fixing member insertion portion 23 of the base member 20, the fixing member 25 and a locking protrusion 24A provided on the locking piece 24 abut against each other, and the locking piece 24 bends downwardly and deforms. When the head 27 of the fixing member 25 is accommodated in the fixing member holding portion 22, the locking piece 24 undergoes elastic return, and the head 27 of the fixing member 25 is locked and held by the fixing member holding portion 22 in a state in which the leg 28 of the fixing member 25 protrudes upward from the base portion 21 (see FIG. 12).

Next, the bus bar 11 and the terminal 32 are attached in this order to the leg 28 that protrudes upward from the base portion 21. Specifically, as shown in FIG. 7, the leg 28 of the fixing member 25 is inserted into the fixing member insertion hole 12 of the bus bar 11 and the fixing member insertion through hole 33 of the terminal 32. The terminal 32 and the connection portion 11A of the bus bar 11 are fixed to the base 27A of the fixing member 25 by screwing the nut portion 29 to the leg 28 to which the bus bar 11 and the terminal 32 are attached. When the nut portion 29 is screwed on after the flange 27B of the head 27 of the bolt portion 26 and the base member 20 abut against each other, the fixing member 25 (the head 27 of the bolt portion 26) and (the base portion 21 of) the base member 20 move in a direction in which they come into contact with the bus bar 11 (upward), and as shown in FIG. 8, the base portion 21 and (the connection portion 11A of) the bus bar 11 come into contact with each other.

Here, because the upper surface of the base portion 21 is set to a level that is higher than the surface of the base 27A of the fixing member 25, the lower surface of the bus bar 11 and the upper surface of the base portion 21 of the base member 20 come into surface contact with each other, and the lower surface of the bus bar 11 and the base 27A of the bolt portion 26 conic into surface contact with each other. Furthermore, the lower surface of the terminal 32 comes into surface contact with the upper surface of the bus bar 11, and the lower surface of the base portion 21 of the base member 20 and the flange 27B of the bolt portion 26 come into surface contact with each other.

Effects of Present Embodiment

Hereinafter, the effects of the present embodiment will be described.

When, in the present embodiment, the connection portion 11A at which the terminal 32 is connected to the bus bar 11 is fixed after the fixing member 25 (the head 27 of the bolt portion 26 and the nut portion 29) and the base portion 21 of the base member 20 are disposed at a position at which they overlap the connection portion 11A of the bus bar 11, the fixing member 25 and the base portion 21 move in a direction in which they come into contact with the bus bar 11 and then come into contact with the bus bar 11. Therefore, according to the present embodiment, because the bus bar 11 and the terminal 32 to which the bus bar 11 is connected are in stable contact with each other, it is possible to provide an electrical connection box 10 with high electrical connection reliability, preventing failures in contact between the bus bar 11 and the terminal 32 that is connected to the bus bar 11 and an increase in the temperature of contact resulting from contact failure.

In particular, according to the present embodiment, since the terminal 32 and the connection portion 11A of the bus bar 11, the connection portion 11A of the bus bar 11 and the base member 20, the connection portion 11A of the bus bar 11 and the base 27A of the head 27 of the bolt portion, the base member 20 and the flange 27B of the head of the bolt portion are respectively in surface contact with each other, the reliability of electrical connection can be reliably increased.

Also, according to the present embodiment, since the case 15 is a heat dissipation member 16 that is made of a heat conductive material, heat generated in the bus bar 11 is dissipated to the outside of the case 15 via the heat dissipation member 16 due to the heat dissipation function of the case 15, and thus the heat dissipation is improved.

Also, according to the present embodiment, since heat generated in the coil 30 is transmitted to the bus bar 11 due to the coil 30 being connected to the terminal 32, and thus this makes it possible to prevent an increase in the temperature of the electrical connection box 10.

In particular, according to the present embodiment, since the end of the coil 30 functions as the terminal 32, it is not necessary to separately attach a terminal to the coil 30.

Embodiment 2

Figure 15:
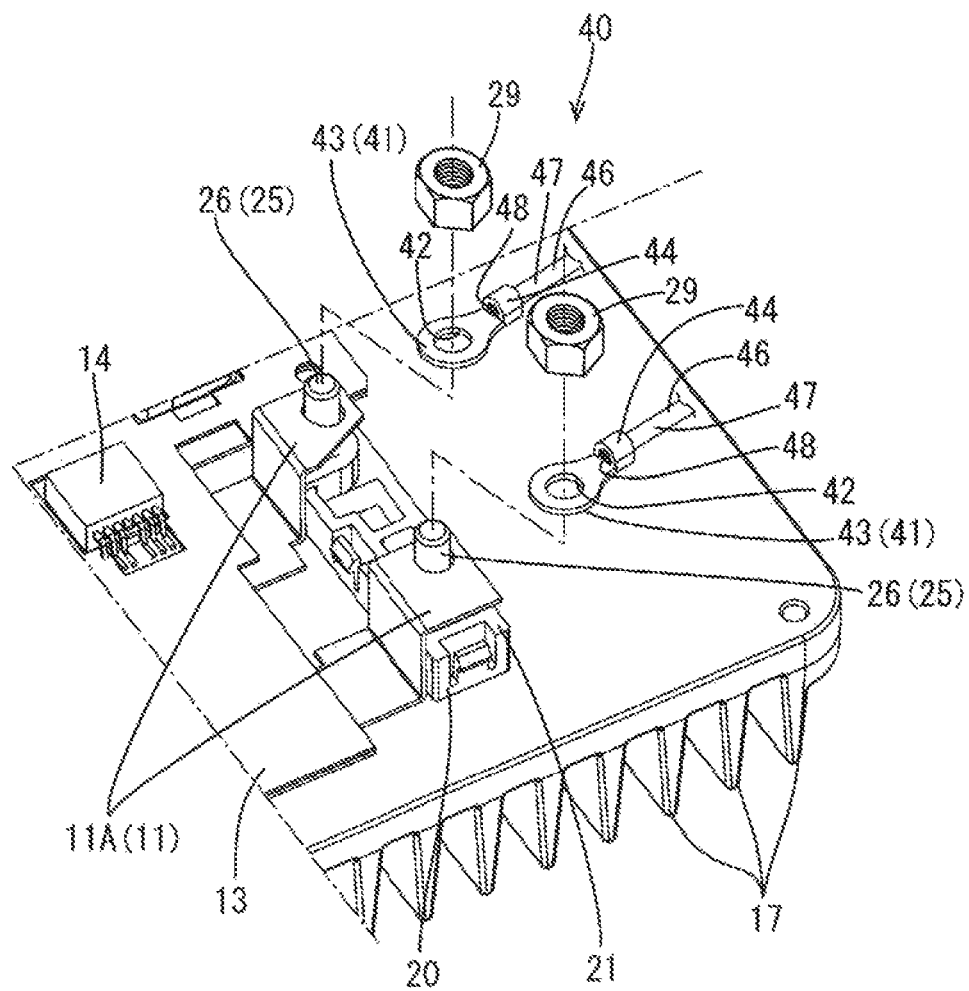
FIG. 15 is a perspective view of a portion of an electrical connection box according to Embodiment 2.

Next, Embodiment 2 of the present invention will be described with reference to FIG. 15.

An electrical connection box 40 of the present embodiment is different from Embodiment 1 in that a member connected to a terminal 41 is an electrical wire 46 (an example of a wiring member). The same reference signs are used to denote structures that are the same as those of Embodiment 1, and their description is omitted.

The terminal 41 that is connected to the connection portion 11A of the bus bar 11 includes a bus bar connection portion 43 that is placed on the bus bar 11 and an electrical wire connection portion 44 to which an electrical wire 46 is connected.

The bus bar connection portion 43 of the terminal 41 is provided with an approximately circular fixing member insertion hole 42 into which the bolt portion 26 of the fixing member 25 is inserted. The electrical wire connection portion 44 is crimped to a terminal end of the electrical wire 46, and is continuous with the bus bar connection portion 43.

The electrical wire 46 is obtained by coating a conductor 48 with an insulating coating 47 made of an insulating resin, and the conductor 48 is exposed by peeling and removing the insulating coating 47 at a terminal end that is connected to the terminal 41. Other structures are substantially the same as those of Embodiment 1.

According to the present embodiment, an electrical connection box 40 with high electrical connection reliability can also be provided. Moreover, in the present embodiment as well, the terminal 41 and the bus bar 11, the bus bar 11 and the base member 20, the bus bar 11 and the base 27A of the head 27 of the bolt portion 26, and the base member 20 and the flange 27B of the head 27 of the bolt portion 26 are respectively in surface contact with each other, and thus the reliability of electrical connection can be reliably increased.

Also, according to the present embodiment, since the electrical wire 46 is connected to the terminal 41, the reliability of electrical connection between the terminal 41 that is connected to the electrical wire 46 and the bus bar 11 can be increased.

Other Embodiments

The present invention is not limited to the embodiments that have been described above with reference to the drawings, and embodiments such as those described below, for example, are also included in the technical scope of the present invention.

(1) In the above-described embodiment, an example has been described in which the case 15 is the heat dissipation member 16 made of a heat conductive material. However, a configuration may be adopted in which a heat dissipation member is not included or in which a case is included separately from a heat dissipation member.

(2) In the above-described embodiment, an example has been described in which the coil 30 is connected to the terminal 32. However, an electronic component other than the coil 30 may be connected to the terminal 32. Moreover, in the above-described embodiment, an example has been described in which the end of the coil 30 functions as the terminal 32. However, a configuration may be adopted in which a terminal that is separate from the coil is included.

(3) in the above-described embodiment, a configuration has been described in which the bus bar 11 is connected to the circuit board 13. However, a configuration may be adopted in which a circuit board is not included.

(4) In the above-described embodiment, an example has been described in which the electrical wire 46 is connected to the terminal 41. However, a wiring member other than electrical wires may be disposed on the terminal 41.

(5) In the above-described embodiment, a configuration has been described in which the lower surface of the bus bar 11 comes into surface contact with the upper surface of the base portion 21 of the base member 20. However, a configuration may be adopted in which the bus bar and the base portion of the base member do not come into contact with each other, such as the case where the upper surface of the base portion protrudes from the base of the fixing member. Also, a configuration may be adopted in which a base is not included as the fixing member.

The invention claimed is:

1. An electrical connection box comprising:
    a bus bar;
    a case to which the bus bar is fixed;
    a terminal that is connected to the bus bar;
    a fixing member that fixes a connection portion at which the terminal and the bus bar are connected to each other; and
    a base member that holds the fixing member, the base member disposed on a portion of the case and underneath the connection portion;
    wherein the fixing member and the base member are disposed at a position at which the fixing member and the base member overlap the connection portion of the bus bar, and when the connection portion at which the terminal and the bus bar are connected to each other is fixed, the base member moves in a direction in which the base member comes into contact with the bus bar, wherein an under surface of the base member is spaced apart and free from the portion of the case.

2. The electrical connection box according to claim 1, wherein the case is a heat dissipation member made of a heat conductive material.

3. The electrical connection box according to claim 1, wherein an electronic component is connected to the terminal.

4. The electrical connection box according to claim 3, wherein the electronic component is a coil.

5. The electrical connection box according to claim 1, wherein a wiring member is connected to the terminal.

6. The electrical connection box according to claim 5, wherein the wiring member is an electrical wire.

7. The electrical connection box according to claim 2, wherein an electronic component is connected to the terminal.

8. The electrical connection box according to claim 2, wherein a wiring member is connected to the terminal.

* * * * *